(12) United States Patent
Choi

(10) Patent No.: US 7,791,404 B2
(45) Date of Patent: Sep. 7, 2010

(54) INTERNAL VOLTAGE GENERATION CIRCUIT AND METHOD FOR SEMICONDUCTOR DEVICE

(75) Inventor: Jun-Gi Choi, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 436 days.

(21) Appl. No.: 11/967,742

(22) Filed: Dec. 31, 2007

(65) Prior Publication Data
US 2008/0219077 A1 Sep. 11, 2008

(30) Foreign Application Priority Data
Mar. 5, 2007 (KR) .................. 10-2007-0021259

(51) Int. Cl.
*G05F 1/10* (2006.01)
(52) U.S. Cl. .................. 327/538; 327/541; 327/543
(58) Field of Classification Search ............. 327/538, 327/541, 543, 530
See application file for complete search history.

(56) References Cited

U.S. PATENT DOCUMENTS

| | | | |
|---|---|---|---|
| 5,263,031 A | 11/1993 | Inoue | |
| 5,687,180 A | 11/1997 | Kawasaki | |
| 5,886,567 A | 3/1999 | Park et al. | |
| 5,901,105 A | 5/1999 | Ong et al. | |
| 6,169,426 B1 | 1/2001 | Lee et al. | |
| 6,774,712 B2 * | 8/2004 | Rhee et al. | 327/540 |
| 6,867,641 B2 * | 3/2005 | Kang et al. | 327/541 |
| 6,922,098 B2 * | 7/2005 | Choi et al. | 327/538 |
| 6,940,765 B2 | 9/2005 | Kyung | |
| 7,049,881 B2 * | 5/2006 | Moon et al. | 327/541 |
| 7,142,044 B2 * | 11/2006 | Sano | 327/540 |
| 7,282,989 B2 * | 10/2007 | Byeon | 327/541 |
| 7,417,494 B2 * | 8/2008 | Choi et al. | 327/541 |

(Continued)

FOREIGN PATENT DOCUMENTS

JP 09-106698 4/1997

(Continued)

OTHER PUBLICATIONS

Notice of Allowance issued from Korean Intellectual Property Office on Feb. 2, 2009 with an English Translation.

(Continued)

*Primary Examiner*—Bao Q Vu
(74) *Attorney, Agent, or Firm*—IP & T Law Firm PLC

(57) ABSTRACT

An internal voltage generation circuit for a semiconductor device and method therefor includes a voltage generator configured to generate voltages with different levels by using an external voltage. A code storing unit is configured to store a selection code to select an internal voltage out of the plurality of voltages. A decoding unit selects the internal voltage from among the plurality of voltages in response to the selection code in a normal mode, and selects the internal voltage out of the plurality of voltages in response to a test selection code set in a test mode. The interval voltage selected in the normal mode is used as an initial value that is a reference of the selection in the test mode.

20 Claims, 11 Drawing Sheets

U.S. PATENT DOCUMENTS 7,599,240 B2 * 10/2009 Shin et al. .................. 365/226

FOREIGN PATENT DOCUMENTS

| JP | 10-199244 | 7/1998 |
| --- | --- | --- |
| JP | 2005-071582 | 3/2005 |
| KR | 10-2002-0053479 A | 7/2002 |
| KR | 1020030077152 A | 10/2003 |

OTHER PUBLICATIONS

Notice of Preliminary Rejection issued from Korean Intellectual Property Office on Feb. 27, 2008 with an English translation.

* cited by examiner

FIG. 6
(PRIOR ART)

|   | FUSE<0> | FUSE<1> | FUSE<2> | TCM<0> | TCM<1> | TCM<2> | CUT<0> | CUT<1> | CUT<2> | Output |
|---|---------|---------|---------|--------|--------|--------|--------|--------|--------|--------|
| 0 | Cut | Cut | No Cut | 1 | 1 | 0 | 1 | 1 | 0 | CS<0> |
| 1 | No Cut | No Cut | Cut | 0 | 0 | 1 | 0 | 0 | 1 | CS<1> |
| 2 | No Cut | Cut | Cut | 0 | 1 | 0 | 0 | 1 | 0 | CS<2> |
| 3 | Cut | No Cut | No Cut | 1 | 0 | 0 | 1 | 0 | 0 | CS<3> |
| 4 | No Cut | No Cut | No Cut | 0 | 0 | 0 | 0 | 0 | 0 | CS<4> |
| 5 | Cut | No Cut | Cut | 1 | 0 | 1 | 1 | 0 | 1 | CS<5> |
| 6 | No Cut | Cut | Cut | 0 | 1 | 1 | 0 | 1 | 1 | CS<6> |
| 7 | Cut | Cut | Cut | 1 | 1 | 1 | 1 | 1 | 1 | CS<7> |

FIG. 12

| | CUTF<0> | CUTF<1> | CUTF<2> | CUT<0> | CUT<1> | CUT<2> | Output | Selection Node |
|---|---|---|---|---|---|---|---|---|
| 0 | | | | 1 | 1 | 0 | CS0<0> | 8UP |
| 1 | | | | 0 | 0 | 1 | CS0<1> | 7UP |
| 2 | | | | 0 | 1 | 0 | CS0<2> | 6UP |
| 3 | 1 | 1 | 0 | 1 | 0 | 0 | CS0<3> | 5UP |
| 4 | | | | 0 | 0 | 0 | CS0<4> | 4UP |
| 5 | | | | 1 | 0 | 1 | CS0<5> | 3UP |
| 6 | | | | 0 | 1 | 1 | CS0<6> | 2UP |
| 7 | | | | 1 | 1 | 1 | CS0<7> | 1UP |
| 0 | | | | 1 | 1 | 0 | CS1<0> | 7UP |
| 1 | | | | 0 | 0 | 1 | CS1<1> | 6UP |
| 2 | | | | 0 | 1 | 0 | CS1<2> | 5UP |
| 3 | 0 | 0 | 1 | 1 | 0 | 0 | CS1<3> | 4UP |
| 4 | | | | 0 | 0 | 0 | CS1<4> | 3UP |
| 5 | | | | 1 | 0 | 1 | CS1<5> | 2UP |
| 6 | | | | 0 | 1 | 1 | CS1<6> | 1UP |
| 7 | | | | 1 | 1 | 1 | CS1<7> | BASE |
| 0 | | | | 1 | 1 | 0 | CS2<0> | 6UP |
| 1 | | | | 0 | 0 | 1 | CS2<1> | 5UP |
| 2 | | | | 0 | 1 | 0 | CS2<2> | 4UP |
| 3 | 0 | 1 | 0 | 1 | 0 | 0 | CS2<3> | 3UP |
| 4 | | | | 0 | 0 | 0 | CS2<4> | 2UP |
| 5 | | | | 1 | 0 | 1 | CS2<5> | 1UP |
| 6 | | | | 0 | 1 | 1 | CS2<6> | BASE |
| 7 | | | | 1 | 1 | 1 | CS2<7> | 1DN |
| 0 | | | | 1 | 1 | 0 | CS3<0> | 5UP |
| 1 | | | | 0 | 0 | 1 | CS3<1> | 4UP |
| 2 | | | | 0 | 1 | 0 | CS3<2> | 3UP |
| 3 | 1 | 0 | 0 | 1 | 0 | 0 | CS3<3> | 2UP |
| 4 | | | | 0 | 0 | 0 | CS3<4> | 1UP |
| 5 | | | | 1 | 0 | 1 | CS3<5> | BASE |
| 6 | | | | 0 | 1 | 1 | CS3<6> | 1DN |
| 7 | | | | 1 | 1 | 1 | CS3<7> | 2DN |
| 0 | | | | 1 | 1 | 0 | CS4<0> | 4UP |
| 1 | | | | 0 | 0 | 1 | CS4<1> | 3UP |
| 2 | | | | 0 | 1 | 0 | CS4<2> | 2UP |
| 3 | 0 | 0 | 0 | 1 | 0 | 0 | CS4<3> | 1UP |
| 4 | | | | 0 | 0 | 0 | CS4<4> | BASE |
| 5 | | | | 1 | 0 | 1 | CS4<5> | 1DN |
| 6 | | | | 0 | 1 | 1 | CS4<6> | 2DN |
| 7 | | | | 1 | 1 | 1 | CS4<7> | 3DN |
| 0 | | | | 1 | 1 | 0 | CS5<0> | 3UP |
| 1 | | | | 0 | 0 | 1 | CS5<1> | 2UP |
| 2 | | | | 0 | 1 | 0 | CS5<2> | 1UP |
| 3 | 1 | 0 | 1 | 1 | 0 | 0 | CS5<3> | BASE |
| 4 | | | | 0 | 0 | 0 | CS5<4> | 1DN |
| 5 | | | | 1 | 0 | 1 | CS5<5> | 2DN |
| 6 | | | | 0 | 1 | 1 | CS5<6> | 3DN |
| 7 | | | | 1 | 1 | 1 | CS5<7> | 4DN |
| 0 | | | | 1 | 1 | 0 | CS6<0> | 2UP |
| 1 | | | | 0 | 0 | 1 | CS6<1> | 1UP |
| 2 | | | | 0 | 1 | 0 | CS6<2> | BASE |
| 3 | 0 | 1 | 1 | 1 | 0 | 0 | CS6<3> | 1DN |
| 4 | | | | 0 | 0 | 0 | CS6<4> | 2DN |
| 5 | | | | 1 | 0 | 1 | CS6<5> | 3DN |
| 6 | | | | 0 | 1 | 1 | CS6<6> | 4DN |
| 7 | | | | 1 | 1 | 1 | CS6<7> | 5DN |
| 0 | | | | 1 | 1 | 0 | CS7<0> | 1UP |
| 1 | | | | 0 | 0 | 1 | CS7<1> | BASE |
| 2 | | | | 0 | 1 | 0 | CS7<2> | 1DN |
| 3 | 1 | 1 | 1 | 1 | 0 | 0 | CS7<3> | 2DN |
| 4 | | | | 0 | 0 | 0 | CS7<4> | 3DN |
| 5 | | | | 1 | 0 | 1 | CS7<5> | 4DN |
| 6 | | | | 0 | 1 | 1 | CS7<6> | 5DN |
| 7 | | | | 1 | 1 | 1 | CS7<7> | 6DN |

INTERNAL VOLTAGE GENERATION CIRCUIT AND METHOD FOR SEMICONDUCTOR DEVICE

CROSS-REFERENCE TO RELATED APPLICATIONS

The present invention claims priority of Korean patent application number 10-2007-0021259, filed on Mar. 5, 2007, which is incorporated by reference in its entirety.

BACKGROUND OF THE INVENTION

The present invention relates to a semiconductor device, and more particularly, to an internal voltage generation circuit for generating a voltage for use in a semiconductor device and a method therefor.

A Dynamic Random Access Memory (DRAM), a type of semiconductor device, uses internal voltages including a core voltage VCORE and a precharge voltage VBLP, in addition to a power supply voltage VDD from outside. Such an internal voltage or a voltage for generating another internal voltage, where an already generated internal voltage is reused to generate another internal voltage with a different level, is generated by an internal voltage generation circuit.

FIG. 1 is a schematic block diagram of a conventional internal voltage generation circuit. Referring to FIG. 1, the conventional internal voltage generation circuit includes a voltage generator 110, a code storage 120, and a decoder 130.

The voltage generator 110 generates a plurality of voltages having different levels by using an external voltage. The code storage 120 includes first to third code storing units 121 to 123 for storing selection codes FUSE<0:2> to select an internal voltage VREFC among the plurality of voltages and outputting it to the decoder 130. In the test mode, the code storage 120 outputs test selection codes TCM<0:2>, not the selection codes FUSE<0:2>, to the decoder 130. Then, the decoder 130 decodes the selection codes FUSE<0:2> or the test selection codes TCM<0:2> provided from the code storage 120 through nodes CUT<0:2> to select the internal voltage VREFC among the plurality of voltages. The operation, the selection codes FUSE<0:2> stored in the code storage 120 are used to set a level of an internal voltage VREFC, but in the test mode, the test selection codes TCM<0:2>, not the selection codes FUSE<0:2>, are used to select the level of an internal voltage VREFC.

FIG. 2 is a detailed circuit diagram of the first code storing unit 121 of FIG. 1, and FIG. 3 diagrammatically shows how a test mode signal are generated. Among the code storing units included in the code storage 120 in FIG. 1, the first code storing unit 121 is illustrated in FIG. 2. The second and third code storing units 122 and 123 only differ from the first code storing unit 121 in that TCM<1>, TCM<2>, FUSE<1>, and FUSE<2> are applied thereto.

In FIG. 2, a power-up signal PWRUP_P is a pulse signal that is generated while a power supply voltage VDD rises after power-up, wherein it is generated at about 1 V when VDD becomes about 1.8 V. This signal turns on a first NMOS transistor N01, and thus the voltage of a node A is initialized to a logic low level. Even though the voltage of the node A is initialized to a logic low level, its logic level varies after a certain amount of time, depending on whether a fuse which is a storing means has been cut. That is, if the fuse has not yet been cut, the voltage of the node A becomes a logic high level. However, if the fuse has been cut, the voltage of the node A becomes a logic low level. Because the voltage of the node A is inverted and then transferred to a node CUT<0>, if the fuse has been cut, the node CUT<0> becomes a logic high level; otherwise, the node CUT<0> becomes a logic low level.

A test mode signal TVCOSUM becomes a logic high level in a test mode, and is generated through a circuit shown in FIG. 3. If any one of test selection codes TCM<0:2> becomes a logic high level, the test mode signal TVCOSUM becomes a logic high level as well. When the test mode signal TVCOSUM becomes a logic high level, a first PMOS transistor P01 is turned on, so that the node A always becomes a logic high level. That is, whether the fuse has been cut or not has no influence on the node A. Thus, a 'low' signal is inputted to the upper terminal among input terminals of a NOR gate N001, and the output of the node CUT<0> becomes equal to the logic level of the test selection code TCM<0>.

In short, the code storage 120 outputs the selection codes FUSE<0:2> stored in its own storing units to the nodes CUT<0:2> in a normal mode. However, when even one of the test selection codes TCM<0:2> is enabled, the code storage 120 automatically enters the test mode and provides the test selection codes TCM<0:2> to the nodes CUT<0:2>.

FIG. 4 is a detailed circuit diagram of the decoder 130 of FIG. 1. Referring to FIG. 4, the decoder 130 decodes the selection codes FUSE<0:2> or the test selection codes TCM<0:2> transferred to the nodes CUT<0:2> outputted from the code storage 120, and outputs voltage selection signals CS<0:7> for selecting one of voltages to be generated by the voltage generator 110.

As shown in the drawing, the decoder 130 is constituted by a plurality of NAND gates NA01 to NA08 and a plurality of inverters I04 to I11, to which signals transferred to the nodes CUT<0:2> are inputted as they are (CUT<0:2>) or in inverted form (CUTB<0:2>). FIG. 6 shows when the voltage selection signals CS<0:7> are enabled.

FIG. 5 is a detailed circuit diagram of the voltage generator 110 of FIG. 1. The voltage generator 110 generates plural voltages 4UP, 3UP, 2UP, 1UP, BASE, 1DN, 2DN, and 3DN to be used as an internal voltage VREFC by a voltage division. The voltage generator 110 shown in the drawing receives a reference voltage VREF through an operational (OP) amplifier 510 whose output is feedbacked, and generates the plural voltages 4UP, 3UP, 2UP, 1UP, BASE, 1DN, 2DN, and 3DN through a voltage division using resistors R1 to R8.

Addressing voltage level, because two input terminals, i.e., the reference voltage VREF and a feedback voltage RFED of the OP amplifier 510, become equal, the feedback voltage RFED becomes equal to the reference voltage VREF. Therefore, a node 501 has a voltage twice the reference voltage, i.e., 2×VREF. The reference voltage VREF is insensitive to temperature and outputted from a bandgap circuit.

The plural voltages are coupled to a plurality of pass gates 521 to 528. The pass gates 521 to 528 are turned on/off by the voltage selection signals CS<0:7> from the decoder 130 and their inverted voltage selection signals CSB<0:7>, and a selected voltage is outputted as the internal voltage VREFC to be used in a semiconductor device.

FIG. 6 is a table describing logic values of the selection codes FUSE<0:2>, the test selection codes TCM<0:2>, and signals at the nodes CUT<0:2> thereby, and the voltage selection signals CS<0:7> that are decoded in the decoder 130 and enabled. It can be seen from FIG. 6 that the nodes CUT<0:2> has logic levels in the normal mode, i.e., the selection codes FUSE<0:2> determine logic levels of the signals at the nodes CUT<0:2>, and in the test mode, i.e., the test selection codes TCM<0:2> determine the logic levels of the signals at the nodes CUT<0:2>, and that voltage selection signals CS<0:7> are decoded to be enabled according to the logic levels of the signals at the node CUT<0:2>.

In general, a semiconductor device experiences variations in transistor characteristics by skew occurring during a process. The skew is generated due to thickness variation of the gate oxide, sheet resistance variation, gate length variation, gate width variation, etc. This characteristic changes the level of a voltage source, for example, which causes each wafer to have a different level.

The internal voltage VREFC suitable for a target voltage is selected by cutting or trimming the fuse, which is the code storing units of the internal voltage generation circuit described above, to store selection codes FUSE<0:2>. When a defect analysis is to be made because of a problem found in a package, it is necessary to conduct a test under variations of the internal voltage VREFC. At this time, the test selection codes TCM<0:2>, which is the test mode signal, is applied to select an internal voltage VREFC again.

In the conventional internal voltage generation circuit set forth above, however, there is no correlation between the selection codes FUSE<0:2> inputted onto the wafer and the test selection codes TCM<0:2> applied during the test. In effect, if the test selection codes TCM<0:2> are inputted, the selection codes FUSE<0:2> stored in the fuse are ignored.

A base level of the internal voltage VREFC previously set is important for an accurate analysis on defects caused by an increase/decrease in the internal voltage VREFC by variations thereof with respect to the base level at the time of defect analysis. However, the conventional internal voltage generation circuit requires the internal voltage VREFC to be set all over again for every test, with the result that it takes relatively long to obtain previous information and to process data at the time of defect analysis.

SUMMARY OF THE INVENTION

Embodiments of the present invention are directed to providing an internal voltage generation circuit that can reduce time for a defect analysis by using an internal voltage which is set after fabricating a wafer as an initial value of the internal voltage, which is varied in a test mode for the defect analysis.

In accordance with an aspect of the present invention, there is provided an internal voltage generation circuit for a semiconductor device, including: a voltage generator configured to generate a plurality of voltages with different levels from an external voltage; a code storing unit configured to store a selection code for an internal voltage from the plurality of voltages; and a decoding unit configured to select the internal voltage out of the plurality of voltages in response to the selection code in a normal mode, and selecting the internal voltage out of the plurality of voltages in response to a test selection code in a test mode, wherein the interval voltage selected in the normal mode is used as a reference for selection of the internal voltage in the test mode.

In accordance with another aspect of the present invention, there is provided an internal voltage generation method for a semiconductor device, including: dividing an external voltage to generate a plurality of voltages; setting one of the plurality of voltages as an internal voltage in response to a selection code in a normal mode; and selecting the internal voltage out of the plurality of voltages in response to a test selection code in a test mode, wherein the interval voltage selected in the normal mode is used as a reference for selection of the internal voltage in the test mode.

BRIEF DESCRIPTION OF THE DRAWINGS

FIG. 6 is a table, which provides logic values of selection codes, test selection codes and CUT<0:2> thereof and shows what signals are decoded in the decoder and enabled.

FIG. 12 is a table showing an overall operation of an internal voltage generation circuit in accordance with an embodiment of the present invention.

DESCRIPTION OF SPECIFIC EMBODIMENTS

Hereinafter, preferred embodiments of the present invention will be set forth in detail with reference to the accompanying drawings.

Figure 7:
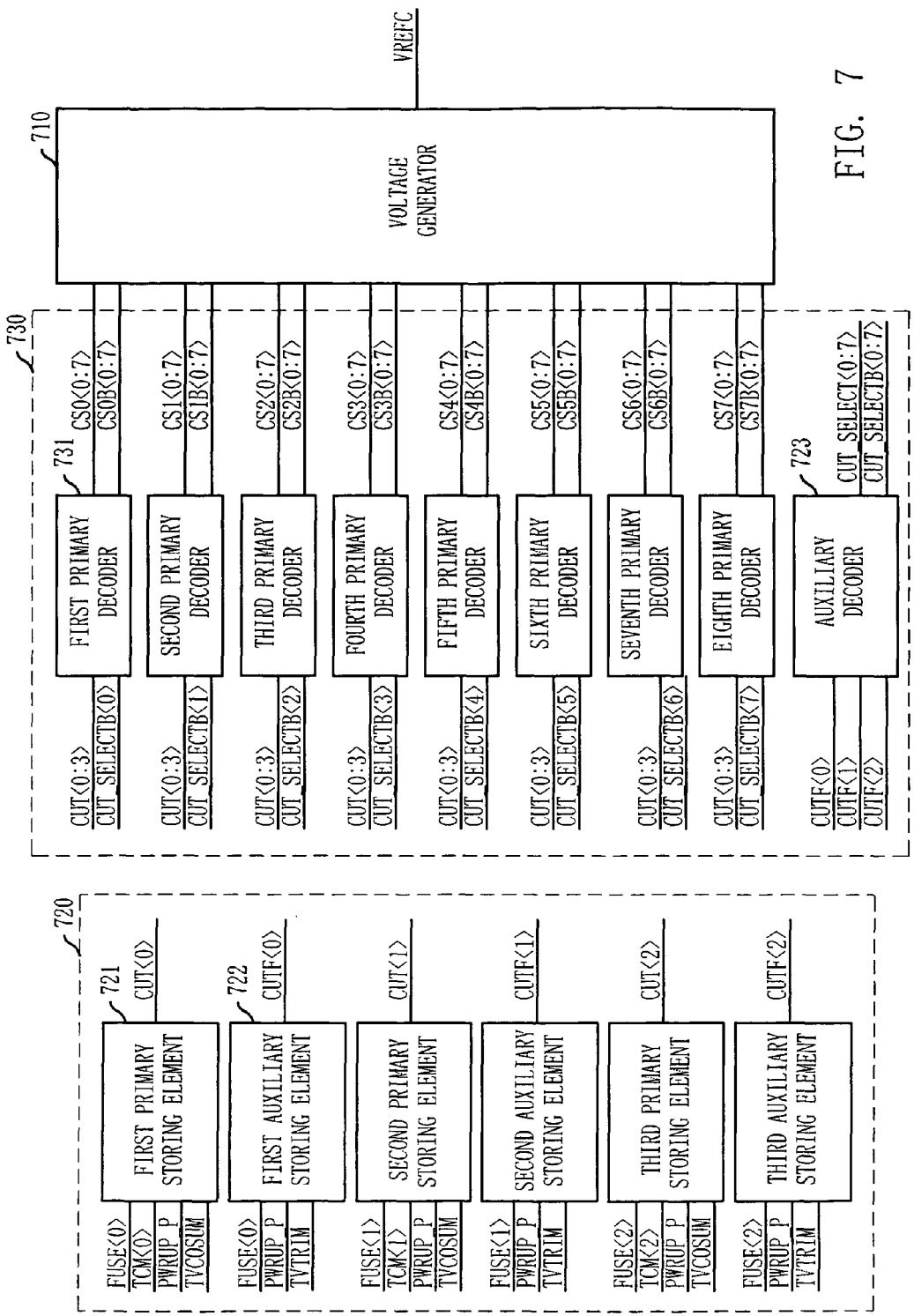
FIG. 7 is a schematic diagram of an internal voltage generation circuit for a semiconductor device in accordance with an embodiment of the present invention.

FIG. 7 is a block diagram of an internal voltage generation circuit for a semiconductor device in accordance with an embodiment of the present invention.

Referring to FIG. 7, an inventive internal voltage generation circuit includes a voltage generator 710, a code storing unit 720, and a decoding unit 730.

The voltage generator 710 generates a plurality of voltages having different levels by using an external voltage. Among these voltages generated by the voltage generator 710, an internal voltage VREFC is selected by the decoding unit 730.

Figure 1:
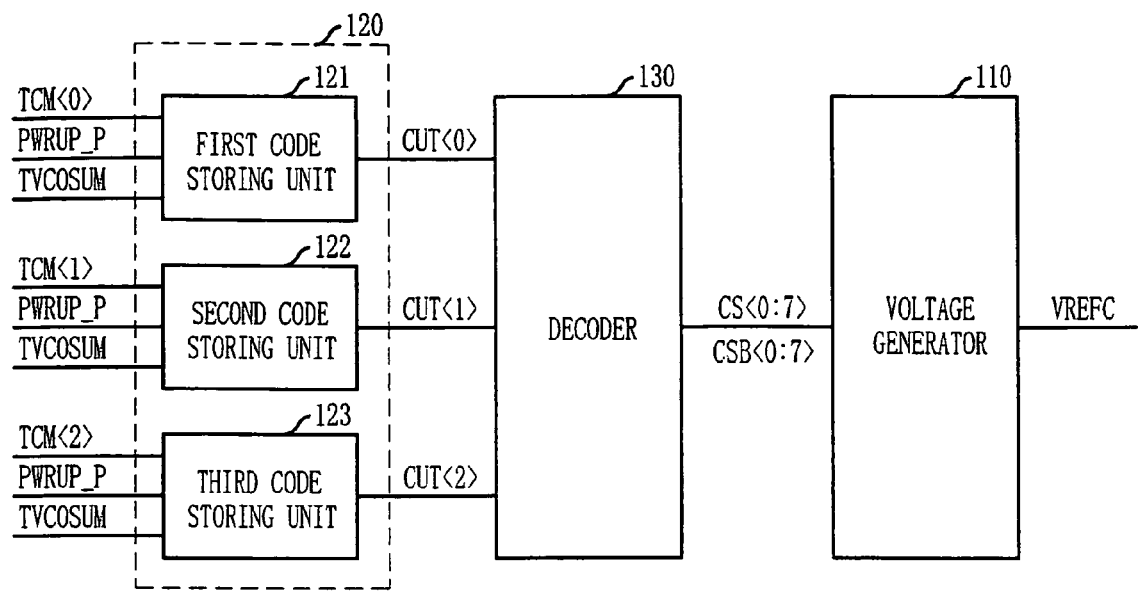
FIG. 1 is a schematic diagram of a conventional n internal voltage generation circuit.

The code storing unit 720 stores selection codes FUSE<0:2> to select the internal voltage VREFC out of the plurality of voltages. In a normal mode, it outputs the selection codes FUSE<0:2> stored in its own storing elements to the decoding unit 730 through first nodes CUT<0:2>, to select the internal voltage VREFC for the normal operation. In a test mode, it outputs the selection codes FUSE<0:2> to the decoding unit 730 through second nodes CUTF<0:2>, to set an initial value for selecting the internal voltage VREFC during the test mode, and outputs test selection codes TCM<0:2> to the decoding unit 730 through first nodes CUT<0:2> to select the internal voltage VREFC based on the initial value. This is different from the existing code storing unit 120 in FIG. 1, which outputs only the selection codes FUSE<0:2> during the normal mode and outputs only the test selection codes TCM<0:2> during the test mode. In case of the code storing unit 720 of the claimed invention, however, the selection codes FUSE<0:2> are outputted during the normal mode, while both the selection codes FUSE<0:2> and the test selection codes TCM<0:2> are outputted to the first nodes CUT<0:2> and the second nodes CUTF<0:2> during the test mode.

The code storing unit 720 may be composed of a plurality of primary storing elements and auxiliary storing elements. In the normal mode, the primary storing elements output the selection codes FUSE<0:2> stored in each primary storing element, which may be composed of fuses, to the decoding unit 730 and, in the test mode, the primary storing elements output the test selection codes TCM<0:2> to the decoding unit 730 through the first nodes CUT<0:2>. Because the code storing unit 720 performs the same function as the existing code storing unit, the circuit shown in FIG. 2 may be utilized as well. The primary storing element may be implemented by using three circuits, each of which is the same as in FIG. 2, and a first test mode signal TVCOSUM may be generated by the circuit in FIG. 3.

In the test mode, the auxiliary storing elements output the selection codes FUSE<0:2> stored in each auxiliary storing element to the decoding unit 730 through the second nodes CUTF<0:2> to set an initial value, which becomes a reference for selecting the internal voltage VREFC during the test mode. Additional details on the first auxiliary storing element 722 will be provided below with reference to FIG. 8.

During the normal operation, the decoding unit 730 selects the internal voltage VREFC out of the plurality of voltages generated by the voltage generator 710, depending on the selection codes FUSE<0:2>. When the test selection codes TCM<0:2> are inputted additionally during the test mode, the decoding unit 730 selects the internal voltage VREFC in response to the test selection codes TCM<0:2>. The initial value becomes the internal voltage, i.e., the internal voltage in the normal mode, selected by the selection codes FUSE<0:2>.

The selection codes FUSE<0:2> have information relating to a value from N to M, N and M being positive integers, and the test selection codes TCM<0:2> have information relating to a value from B to A, A and B being positive integers. In the normal mode, the decoding unit 730 selects a voltage, which is one of the plurality of voltages, as the internal voltage VREFC according to the selection codes FUSE<0:2>, where the voltage has a value between N and M on the basis of a preset voltage which is one of the plurality of voltages and which corresponds to a voltage at a base node. Meanwhile, in the test mode, the decoding unit 730 selects a voltage which is one of the plurality of voltages as the internal voltage VREFC according to the test selection codes TCM<0:2>, where the voltage has a value between B and A on the basis of the internal voltage selected in the normal mode. When selecting the internal voltage VREFC in the test mode, a voltage gets changed by considering the internal voltage VREFC of the normal mode.

The decoding unit 730 may be composed of a plurality of primary decoders and an auxiliary decoder 732. Each of the primary decoders has a different voltage as its initial value, e.g., the first primary decoder 731 has a value of 4UP as its initial value, and the second primary decoder has a value of 3UP as its initial value. The internal voltage VREFC is selected depending on the selection codes FUSE<0:2> or the test selection codes TCM<0:2> outputted from the primary storing elements 721 through the first nodes CUT<0:2>. In other words, the internal voltage VREFC is selected directly by the primary decoders, and it is made by the selection codes FUSE<0:2> or the test selection codes TCM<0:2> outputted from the primary storing elements 721 through the first nodes CUT<0:2>. Additional details regarding the first decoder will be provided below with reference to FIG. 9.

The auxiliary decoder 732 receives the selection codes FUSE<0:2> outputted from the auxiliary storing elements, decides which one of the plurality of primary decoders is used to select the internal voltage VREFC, and selects one of the primary decoders to be enabled. The auxiliary decoder 732 receives the selection codes FUSE<0:2> outputted from the auxiliary storing elements through the second nodes CUTF<0:2> and decodes them into eight different decoding selection signals CUT_SELECT<0:7>. The circuit shown in FIG. 4 may be used as the auxiliary decoder 732 as is, except for replacing the voltage selection signals CS<0:7> by the decoding selection signals CUT_SELECT<0:7> of FIG. 7

Figure 8:
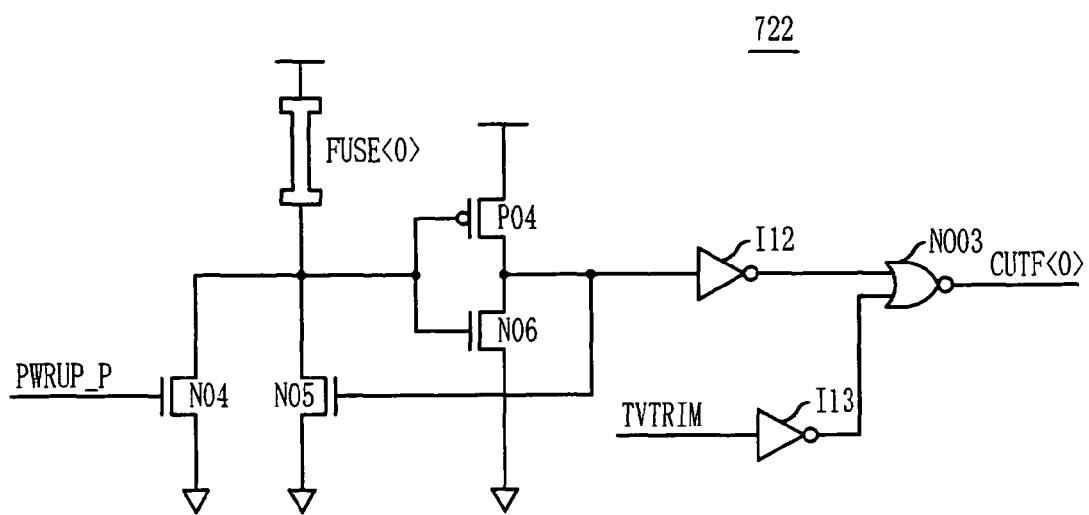
FIG. 8 is a schematic diagram of a second storing element shown in FIG. 7.

FIG. 8 is a schematic diagram of the first auxiliary storing element 722 shown in FIG. 7. FIG. 8 shows only one of the first auxiliary storing elements 722 of FIG. 7, and the second to third auxiliary storing elements may be composed in the same manner by properly changing the reference numerals of input signals.

Figure 2:
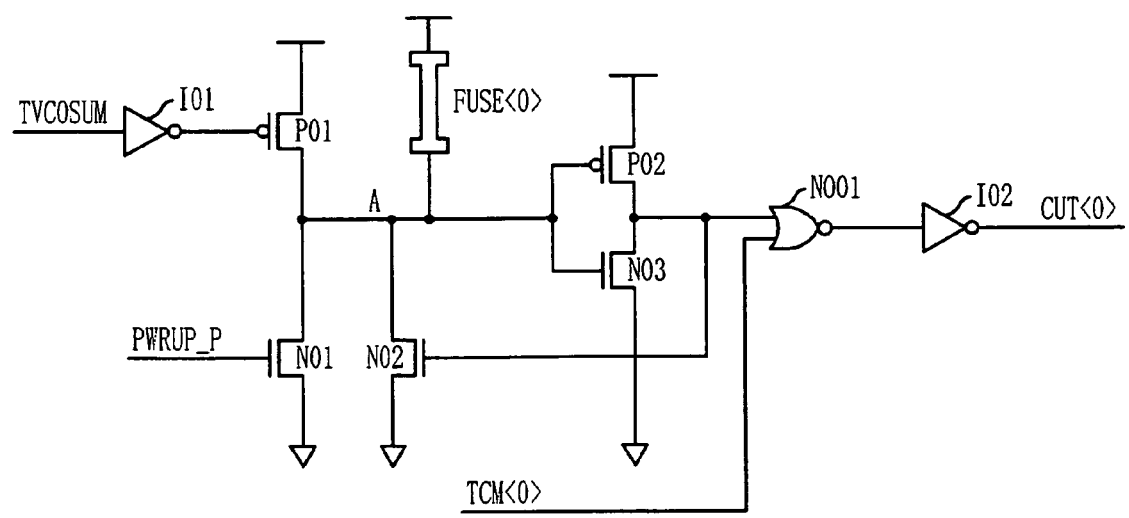
FIG. 2 is a detailed circuit diagram of the code storing unit shown in FIG. 1.
Figure 3:
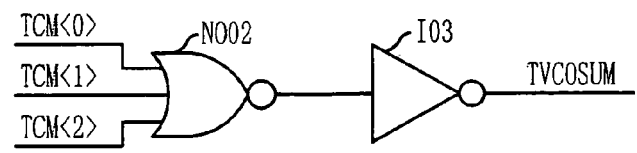
FIG. 3 diagrammatically shows how a test mode signal is generated in the prior art.

Referring to FIG. 8, the first auxiliary storing element 722 is analogous to the first code storing unit 121 of FIG. 2, i.e., the first primary storing element 721, in basic configuration. Therefore, the description below will focus mainly on the differences between them.

The first auxiliary storing element 722, unlike the first primary storing element 721, does not receive the test selection codes TCM<0:2>, but outputs only the selection codes FUSE<0:2> stored in its fuse to the second nodes CUTF<0:2>. A second test mode signal TVTRIM is enabled in the test mode and is disabled in the normal mode, causing logic levels of the second nodes CUTF<0:2> to be (0, 0, 0).

When the logic levels of the second nodes CUTF<0:2> become (0, 0, 0), the auxiliary decoder 732 having the same initial value as the original initial value in the normal mode is selected. Since the second test mode signal TVTRIM is enabled only in the test mode, it can be generated identically to the first test mode signal TVCOSUM shown in FIG. 3. At this time, it may be configured such that the first auxiliary storing element 722 enters the test mode automatically when any one of the test selection codes TCM<0:2> is enabled.

When the second test mode signal TVTRIM is enabled in the test mode, the selection codes FUSE<0:2> are outputted to the second nodes CUTF<0:2>. Therefore, the auxiliary decoder 732 selects one of the primary decoders for selection of the internal voltage VREFC according the selection codes FUSE<0:2>.

The selection codes FUSE<0:2> stored in the primary storing elements and the selection codes FUSE<0:2> stored in the auxiliary storing elements differ from each other only in terms of output timings and output nodes. Therefore, the fuse provided in the primary and the auxiliary storing elements 721 and 722 is one fuse rather than two. When a first selection code FUSE<0> is cut, the first selection code FUSE<0> of the first primary storing element 721 and that of the first auxiliary storing element 722 are all cut.

Figure 9:
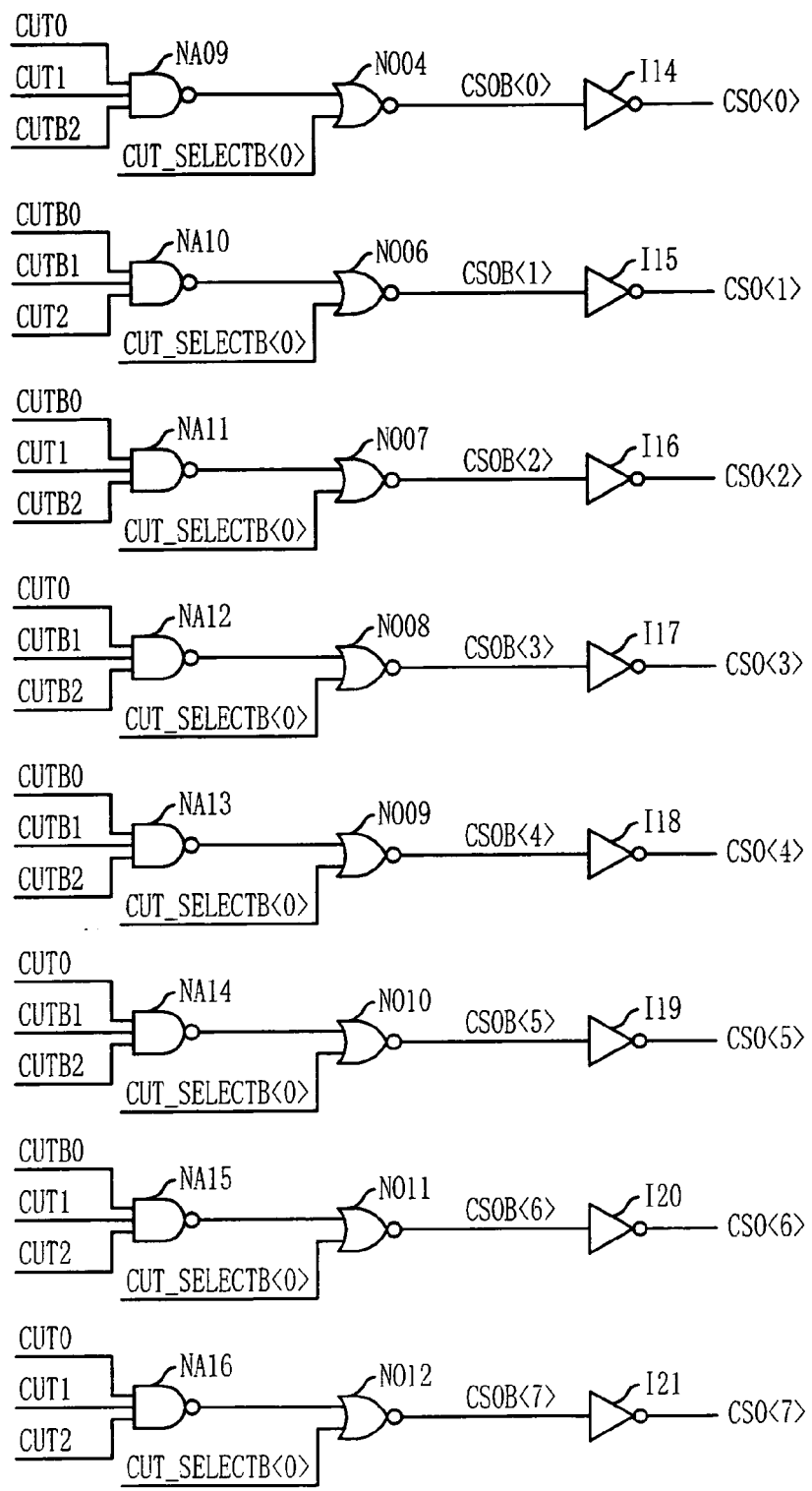
FIG. 9 illustrates a detailed circuit diagram of a first decoder depicted in FIG. 7.

FIG. 9 illustrates a detailed circuit diagram of the first primary decoder 731 depicted in FIG. 7. In the embodiment of FIG. 7, there are eight primary decoders, but only the first primary decoder 731 on the top is illustrated in FIG. 9. The remaining primary decoders are identical to the first primary decoder 731 of FIG. 9, except with respect to reference numerals of input signals.

Figure 4:
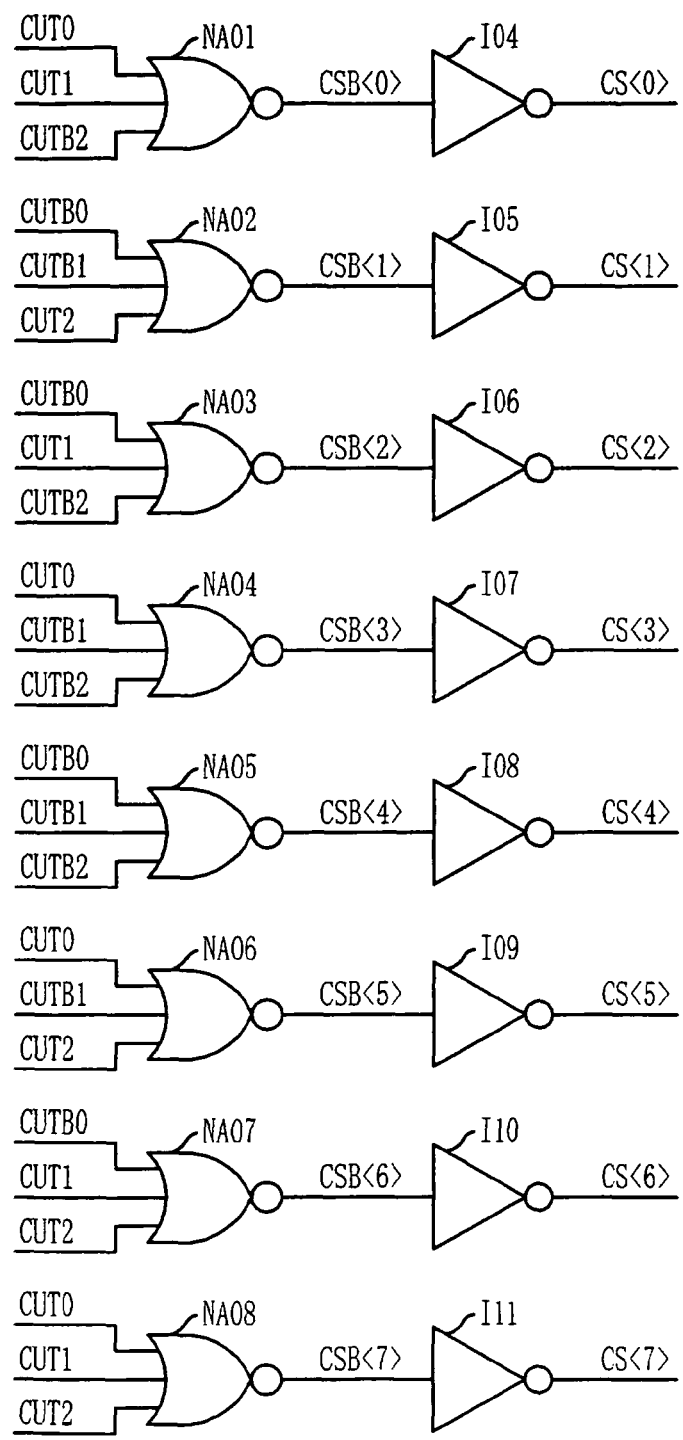
FIG. 4 is a detailed circuit diagram of the decoder shown in FIG. 1.
Figure 5:
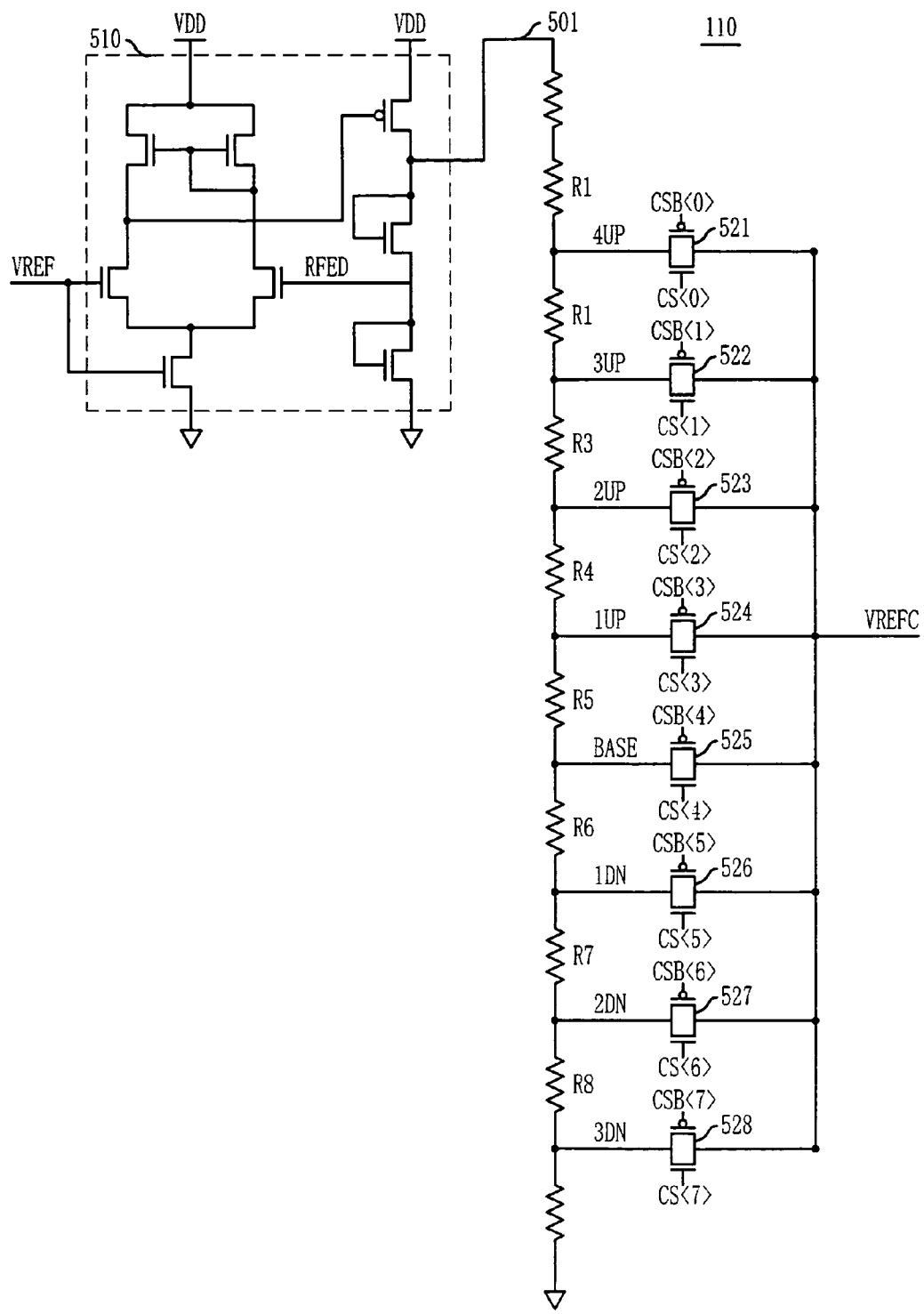
FIG. 5 is a detailed circuit diagram of the voltage generator shown in FIG. 1.

The first primary decoder 731 is analogous to the decoder 130 shown in FIG. 4, i.e., except that it is enabled or disabled by a first decoding selection bar signal CUT_SELECTB<0>. In other words, when the first decoding selection bar signal CUT_SELECTB<0> inputted to NOR gates NO04 to NO11 is a logic high level, all first voltage selection signals CS0<0:7> are outputted as a logic low level. The outputting of the first voltage selection signals CS0<0:7> as a logic low level means that the first primary decoder 731 has not been able to select any voltage. However, when the first decoding selection bar signal CUT_SELECTB<0> is inputted as a logic low level, the first primary decoder 731 shown in FIG. 9 enables one of the first voltage selection signals CS0<0:7> and thus selects the internal voltage VREF. The overall operation of the first primary decoder 731 is illustrated in the table of FIG. 12.

Figure 10:
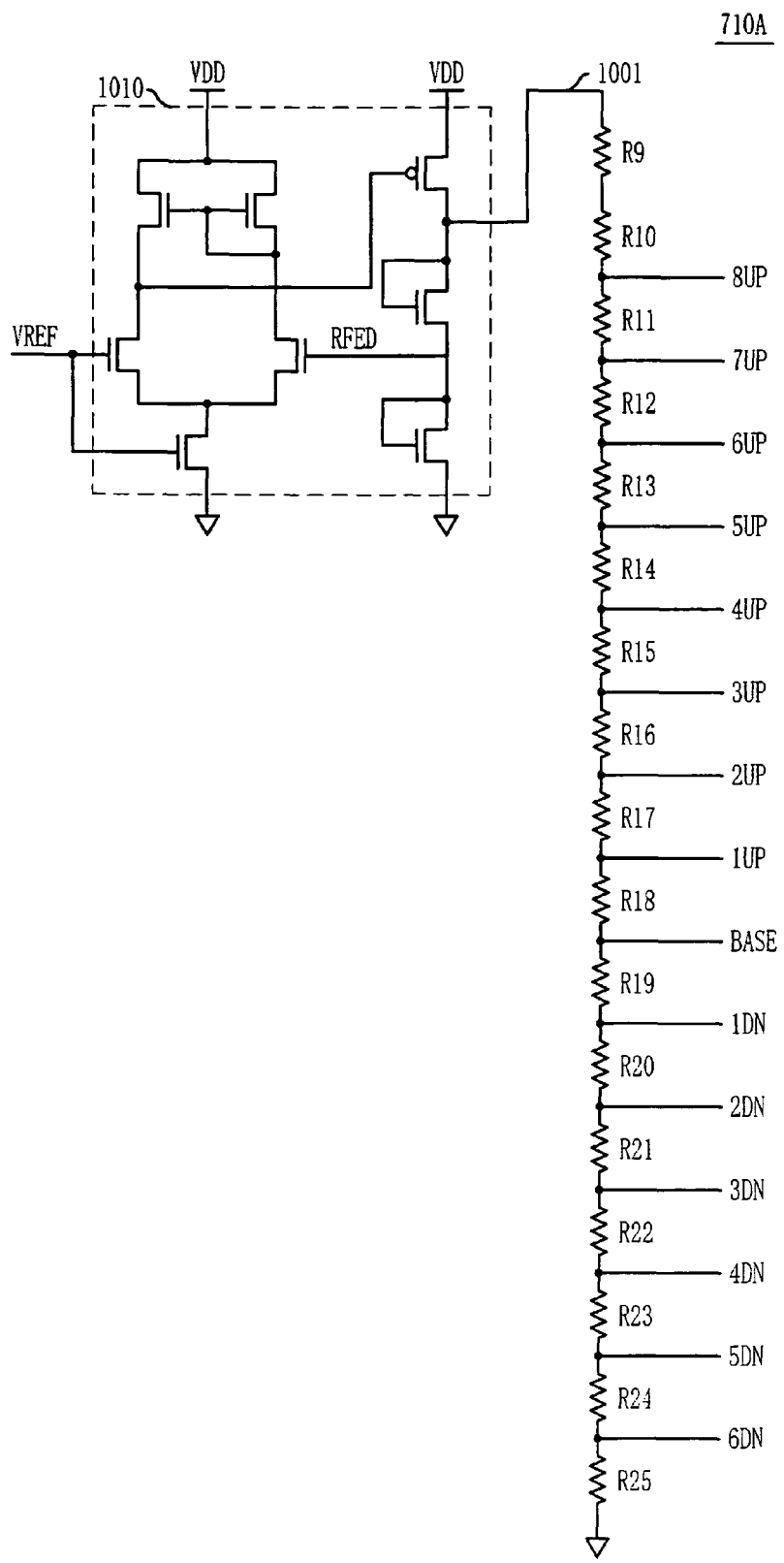
FIG. 10 is a circuit diagram illustrating a front end of a voltage generator in FIG. 7.
Figure 11:
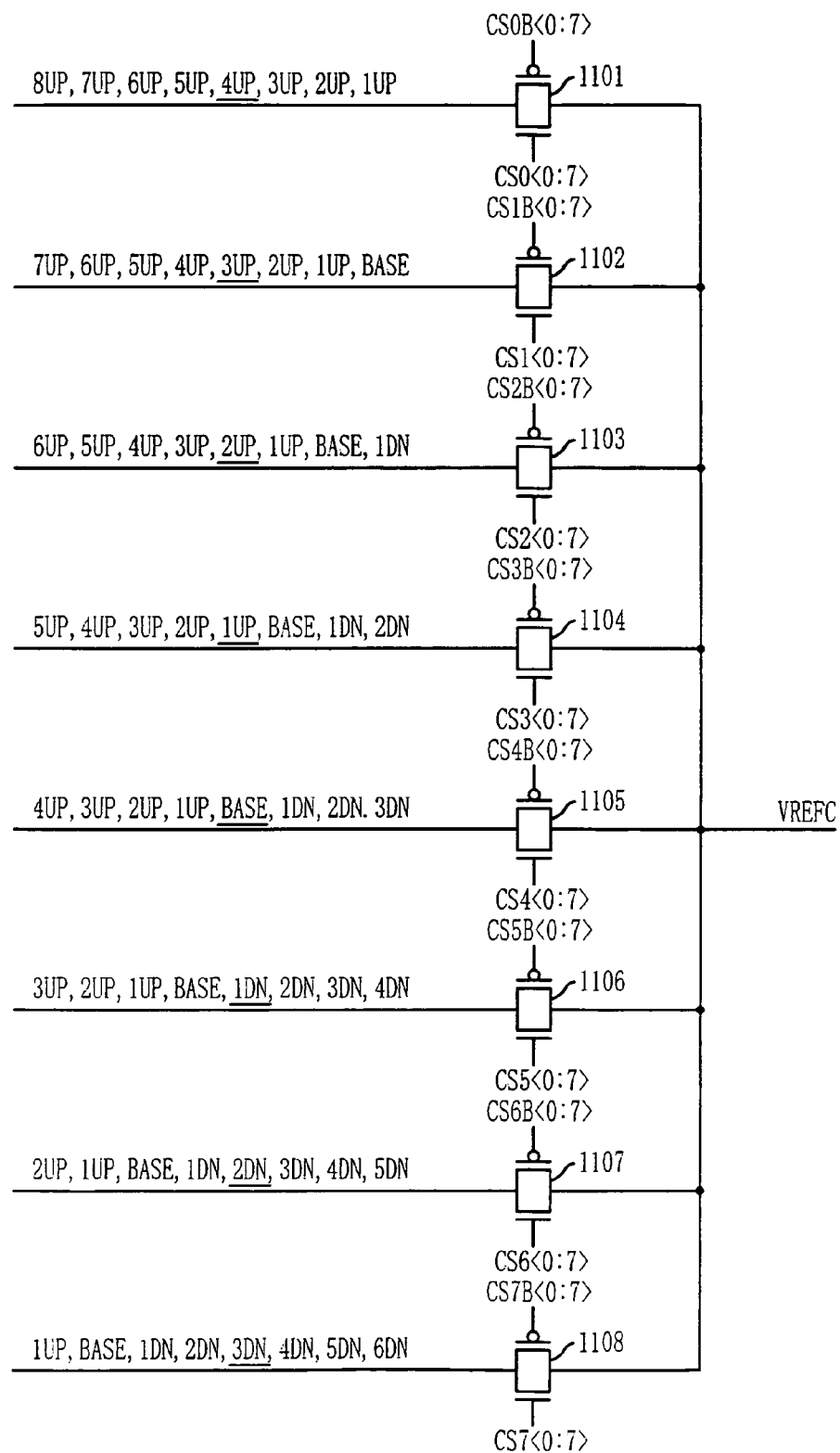
FIG. 11 is a circuit diagram illustrating a rear end of the voltage generator in FIG. 7.

FIG. 10 is a circuit diagram illustrating a front end of the voltage generator 710A of FIG. 7, and FIG. 11 is a circuit diagram illustrating a rear end of the voltage generator 710B. Referring to FIG. 10, the voltage generator 710 generates the plural voltages 8UP, 7UP, 6UP, 5UP, 4UP, 3UP, 2UP, 1UP, BASE, 1DN, 2DN, 3DN, 4DN, 5DN, and 6DN to be used as internal voltages by a voltage division.

The front end of voltage generator 710A shown in FIG. 10 receives a reference voltage VREF through an OP amplifier 1010 whose output is feedbacked, and generates the plural voltages 8UP, 7UP, 6UP, 5UP, 4UP, 3UP, 2UP, 1UP, BASE, 1DN, 2DN, 3DN, 4DN, 5DN, and 6DN by a voltage distribution using a plurality of resistors R9 to R25. The generation of the increased number of voltages compared with the prior art is because it is possible to make a wider range of variations in the interval voltage VREFC again in the test mode on the basis of the internal voltage VREFC set in the normal mode.

With respect to voltage level, because two input terminals, i.e., the reference voltage VREF and a feedback voltage RFED of the OP amplifier 1010, become equal, the feedbacked voltage RFED becomes equal to the reference voltage VREF. Therefore, a node 1001 has a voltage twice the reference voltage VREF, i.e., 2×VREF. The reference voltage VREF is insensitive to temperature and outputted from a bandgap circuit.

As described earlier, the voltage generator 710 generates voltages 8UP, 7UP, 6UP, 5UP, 4UP, 3UP, 2UP, 1UP, BASE, 1DN, 2DN, 3DN, 4DN, 5DN, and 6DN of different levels. Therefore, the voltage generator 710 may be implemented in a variety of forms, beside the one shown in FIG. 10.

Referring to FIG. 11, the rear end of the voltage generator 710B is provided with a plurality of pass gates 1101 to 1108. Even though FIG. 11 shows the eight pass gates 1101 to 1108, each of the eight pass gates 1101 to 1108 is composed of eight pass gates to receive corresponding voltage selection signals CS0<0:7> to CS7<0:7> and output nodes of the front end 710B (in left-to-right order) correspond to the pass gates, respectively.

For example, the pass gate 1101 shown on the top corresponds to (8UP, CS0<0>), (7UP, CS0<1>), (6UP, CS0<2>), (5UP, CS0<3>), (4UP, CS0<4>), (3UP, CS0<5>), (2UP, CS0<6>), and (1UP, CS0<7>). In this manner, the rest of other pass gates 1102 to 1108 correspond to plural voltages 8UP, 7UP, 6UP, 5UP, 4UP, 3UP, 2UP, 1UP, BASE, 1DN, 2DN, 3DN, 4DN, 5DN, and 6DN, and all of them are turned on/off whether or not their corresponding voltage selection signals CS0<0:7>, CS1<0:7>, CS2<0:7>, CS3<0:7>, CS4<0:7>, CS5<0:7>, CS6<0:7>, and CS7<0:7> are enabled, thereby outputting the internal voltage VREFC.

FIG. 12 is a table illustrating the overall operation of the internal voltage generation circuit in accordance with an embodiment of the present invention of the present invention. The table of FIG. 12 provides information about the voltage selection signals CS0<0:7>, CS1<0:7>, CS2<0:7>, CS3<0:7>, CS4<0:7>, CS5<0:7>, CS6<0:7>, and CS7<0:7>, and a selected one of the plural voltages 8UP, 7UP, 6UP, 5UP, 4UP, 3UP, 2UP, 1UP, BASE, 1DN, 2DN, 3DN, 4DN, 5DN, and 6DN which are selected by every combination of signals at the first nodes CUT<0:2> and the second nodes CUTF<0:2>.

In the normal mode, the logic levels of the second nodes CUTF<0:2> become (0, 0, 0). Therefore, the internal voltage VREFC is selected to have a value between N and M on the basis of the voltage BASE at the base node according to the signals transferred through the first nodes CUT<0:2>, i.e., the selection codes FUSE<0:2>. On the other hand, in the test mode, an initial value is determined by the signals transferred through the second nodes CUTF<0:2>, i.e., the selection codes FUSE<0:2>, the initial value being the internal voltage REFC selected in the normal mode, and the internal voltage VREFC is varied and selected to have a value between B and A on the basis of the initial value based on the signals transferred through the first nodes CUT<0:2>, i.e., the test selection codes TCM<0:2>.

In other words, when the internal voltage VREFC is set in the wafer step and is varied in the test mode for defect analysis in the package step, the defect analysis can be accomplished within a shorter amount of time by using the correlation between the two steps.

A method for generating an internal voltage for a semiconductor device in accordance with another embodiment of the invention Referring will now be described with reference to FIGS. 7 to 11.

In one embodiment, the internal voltage generation method includes a first step of dividing an external voltage to generate plural voltages 8UP, 7UP, 6UP, 5UP, 4UP, 3UP, 2UP, 1UP, BASE, 1DN, 2DN, 3DN, 4DN, 5DN, and 6DN; a second step of setting one of the plurality of voltages 8UP, 7UP, 6UP, 5UP, 4UP, 3UP, 2UP, 1UP, BASE, 1DN, 2DN, 3DN, 4DN, 5DN, and 6DN as an internal voltage VREFC in response to selection codes FUSE<0:2>; and a third step of selecting the internal voltage VREFC among the plurality of voltages 8UP, 7UP, 6UP, 5UP, 4UP, 3UP, 2UP, 1UP, BASE, 1DN, 2DN, 3DN, 4DN, 5DN, and 6DN during a test mode in response to test selection codes TCM<0:2>, which is a test mode signal, where an initial value used as a reference for the selection is determined based on the internal voltage VREFC set in the second step. At this time, the selection codes FUSE<0:2> have information relating to a value from N to M, N and M being positive integers, and the test selection codes TCM<0:2> have information relating to a value from B to A.

The second step is characterized by selecting a voltage which is one of the plural voltages 8UP, 7UP, 6UP, 5UP, 4UP, 3UP, 2UP, 1UP, BASE, 1DN, 2DN, 3DN, 4DN, 5DN, and 6DN as the internal voltage VREFC according to the selection codes FUSE<0:2>, wherein the voltage has the value between N and M on the basis of a preset voltage corresponding to a voltage at a base node, i.e., BASE. Moreover, the third step is characterized by selecting a voltage with which is one of the plural voltages 8UP, 7UP, 6UP, 5UP, 4UP, 3UP, 2UP, 1UP, BASE, 1DN, 2DN, 3DN, 4DN, 5DN, and 6DN) as the internal voltage VREFC according to the test selection codes TCM<0:2>, wherein the voltage has a value between B and A on the basis of the internal voltage selected in the second step. The internal voltage VREFC set in the second step may be an interval voltage used during the operation of the semiconductor device, while the internal voltage VREFC set in the third step may be an internal voltage set for test.

In addition, the selection codes FUSE<0:2> in the second step are inputted to match the internal voltage VREFC with a target voltage in the wafer step during the fabrication process of the semiconductor device. Meanwhile, the test selection codes TCM<0:2> mentioned the third step are inputted so as to make a variation to the internal voltage VREFC during test following the wafer step.

In accordance with the present invention, in case a defect analysis needs to be done by variations of the level of an internal voltage VREF during test after the internal voltage VREFC used for a semiconductor device has been matched with a target voltage, it is possible to change the internal voltage VREFC on the basis of a preset internal voltage VREFC during the test. This means that there is no need to set the internal voltage VREFC all over again for the test, so that time loss in obtaining previous information at the time of defect analysis and in data processing can be overcome.

While the present invention has been described with respect to the specific embodiments, it will be apparent to those skilled in the art that various changes and modifications may be made without departing from the spirit and scope of the invention as defined in the following claims.

What is claimed is:

1. An internal voltage generation circuit for a semiconductor device, comprising:
   a voltage generator configured to generate a plurality of voltages with different levels from an external voltage;
   a code storing unit configured to store a selection code for an internal voltage from the plurality of voltages; and
   a decoding unit configured to select the internal voltage out of the plurality of voltages in response to the selection code in a normal mode, and to select the internal voltage out of the plurality of voltages in response to a test selection code in a test mode;
   wherein the interval voltage selected in the normal mode is used as a reference for selection of the internal voltage in the test mode.

2. The internal voltage generation circuit of claim 1, wherein the decoding unit is configured to obtain information relating to a value from N to M by decoding the selection code, and is configured to obtain information relating to a value from B to A by decoding the test selection code, and wherein A, B, M and N are positive integers.

3. The internal voltage generation circuit of claim 2, wherein:
   the decoding unit is configured to select one of the plurality of voltages as the internal voltage according to the selection code in the normal mode, wherein the voltage has a value between N and M based on a preset voltage which is one of the plurality of voltages; and
   the decoding unit is configured to select one of the plurality of voltages as the internal voltage according to the test selection code in the test mode, wherein the voltage has a value between B and A on the basis of the internal voltage selected in the normal mode.

4. The internal voltage generation circuit of claim 1, wherein the code storing unit is configured to output the selection code stored in its storing unit to the decoding unit in the normal mode for selection of an internal voltage for a normal operation; and
   the code storing unit is configured to output the selection code to the decoding unit to set the initial value, and to output the test selection code to the decoding unit in the test mode for selection of an internal voltage for a test.

5. The internal voltage generation circuit of claim 4, wherein the storing unit includes at least one fuse, and is configured to store the selection code depending on a condition of the fuse.

6. The internal voltage generation circuit of claim 1, wherein the code storing unit includes:
   a first storing element configured to output the selection code stored in its storing unit to the decoding unit in the normal mode and to output the test selection code to the decoding unit in the test mode; and
   a second storing element configured to output the selection code stored in its storing unit to the decoding unit in the test mode to set the initial value used as the reference for selection of the internal voltage during the test mode.

7. The internal voltage generation circuit of claim 6, wherein the storing unit includes at least one fuse, and is configured to store the selection code depending on a condition of the fuse.

8. The internal voltage generation circuit of claim 6, wherein the first storing element automatically enters the test mode if the test selection code is enabled.

9. The internal voltage generation circuit of claim 6, wherein the second storing element is configured to output the selection code with a fixed logic level in the normal mode, and automatically to enter the test mode to output the selection code if the test selection code is enabled.

10. The internal voltage generation circuit of claim 6, wherein the decoding unit includes:
    a plurality of first decoders, each having a different voltage from the plurality of voltages as its initial value, configured to select the internal voltage in response to an output signal from the first storing element; and
    a second decoder configured to receive an output signal of the second storing element and to decide which of the plurality of first decoders is used to select the internal voltage.

11. The internal voltage generation circuit of claim 1, wherein the voltage generator includes a plurality of pass gates for outputting the plurality of voltages, and the decoding unit controls an on/off operation of the plurality of pass gates.

12. The internal voltage generation circuit of claim 1, wherein the voltage generator is configured to output the plurality of voltages by dividing a voltage provided from outside.

13. The internal voltage generation circuit of claim 1, wherein the selection code is set to match the internal voltage with a target voltage in a wafer step during fabrication of the semiconductor device.

14. The internal voltage generation circuit of claim 12, wherein the test selection code is set to vary a level of the internal voltage during the test mode after setting the selection code.

15. An internal voltage generation method for a semiconductor device, comprising:
    dividing an external voltage to generate a plurality of voltages;
    setting one of the plurality of voltages as an internal voltage in response to a selection code in a normal mode; and
    selecting the internal voltage out of the plurality of voltages in response to a test selection code in a test mode,
    wherein the interval voltage selected in the normal mode is used as a reference for selection of the internal voltage in the test mode.

16. The internal voltage generation method of claim 15, wherein the selection code has information relating to a value from N to M, and the test selection code has information relating to a value from B to A, and wherein A, B, M and N are positive integers.

17. The internal voltage generation method of claim 15, wherein
    one of the plurality of voltages is set as the internal voltage according to the selection code in the normal mode, wherein the set voltage has a value between N and M on the basis of a preset voltage which is one of the plurality of voltages; and
    the internal voltage is selected from among the plurality of voltages according to the test selection code in the test mode, wherein the selected voltage has a value between B and A on the basis of the internal voltage set in the normal mode.

18. The internal voltage generation method of claim 15, wherein, in the setting of one of the plurality of voltages, the input of the selection code is made depending on a condition of at least one fuse.

19. The internal voltage generation method of claim 15, wherein, in the setting of one of the plurality of voltages, the internal voltage is a voltage used when the semiconductor device operates.

20. The internal voltage generation method of claim 15, wherein, in the setting of one of the plurality of voltages, the input of the selection code matches the internal voltage with a target voltage in a wafer step during fabrication of the semiconductor device, and, in the selecting of the internal voltage, the test selection code is inputted to vary the internal voltage during the test mode after the wafer step.

* * * * *